United States Patent [19]
Gordon et al.

[11] 3,964,302
[45] June 22, 1976

[54] VEHICLE MONITORING SYSTEM

[75] Inventors: James Sneddon Gordon; Carl Siegmund den Brinker, both of Bedford, England

[73] Assignee: Texas Instruments Incorporated, Dallas, Tex.

[22] Filed: Nov. 27, 1974

[21] Appl. No.: 527,552

[30] Foreign Application Priority Data
Dec. 5, 1973 United Kingdom............... 56388/73

[52] U.S. Cl. ........................... 73/117.3; 340/52 F; 340/413
[51] Int. Cl.² ........................................ G01M 17/00
[58] Field of Search ........................ 73/117.3, 116; 235/150.2; 340/413, 52 F

[56] References Cited
UNITED STATES PATENTS

| | | | |
|---|---|---|---|
| 2,981,107 | 4/1961 | Anderson | 340/413 UX |
| 3,630,076 | 12/1971 | Standt | 73/117.3 |
| 3,651,454 | 3/1972 | Venema et al. | 340/52 |
| 3,738,174 | 6/1973 | Waldron | 73/1 F X |
| 3,764,983 | 10/1973 | Stok | 340/413 X |
| 3,777,121 | 12/1973 | Jamieson | 340/378 R X |
| 3,866,166 | 2/1975 | Kerscher et al. | 340/413 X |
| 3,906,437 | 9/1975 | Brandwein et al. | 73/117.3 X |

*Primary Examiner*—Jerry W. Myracle
*Attorney, Agent, or Firm*—Hal Levine; James T. Comfort; Richard L. Donaldson

[57] ABSTRACT

Electrical signals representing analog values of variables to be measured are sampled and multiplexed onto a common conductor. When the analog values are generated by transducers having a logarithmic characteristic, the signals are linearized by a log amplifier prior to being multiplexed. The ranges of the analog signals are made similar to facilitate use of a common display. A single analog-to-digital converter generates digital outputs representing the amplitudes of the respective analog samples and the digital outputs control display logic for operating the common display. A sequence timer controls operation of the multiplexer, analog-to-digital converter, display logic, and the display itself. Facility for manual override to display selectively any of the variables is provided, as well as an alarm indicator for generating an audible or visual alarm signal in the event any variable exceeds (or drops below) a predetermined reference level. An electroluminescent seven-segment display and quantised analog displays are described. The system is described with particular reference to an automotive display system for monitoring, e.g. fuel level, oil pressure, coolant temperature, and battery voltage.

20 Claims, 7 Drawing Figures

| | $a_1$ | $b_1$ | $a_2$ | $b_2$ | $c_2$ | $d_2$ | $e_2$ | $f_2$ | $g_2$ | $a_3$ | $b_3$ | $c_3$ | $d_3$ | $e_3$ | $f_3$ | $g_3$ |
|---|---|---|---|---|---|---|---|---|---|---|---|---|---|---|---|---|
| 5   | 1 | 1 | 0 | 0 | 0 | 1 | 0 | 0 | 0 | 0 | 0 | 1 | 0 | 1 | 0 | 0 |
| 10  | 1 | 1 | 1 | 1 | 0 | 1 | 1 | 0 | 1 | 0 | 0 | 0 | 1 | 0 | 0 | 0 |
| 15  | 1 | 1 | 1 | 1 | 0 | 1 | 1 | 0 | 1 | 0 | 0 | 1 | 0 | 1 | 0 | 0 |
| 20  | 1 | 1 | 0 | 1 | 0 | 0 | 0 | 1 | 0 | 0 | 0 | 0 | 1 | 0 | 0 | 0 |
| 25  | 1 | 1 | 0 | 1 | 0 | 0 | 0 | 1 | 0 | 0 | 0 | 1 | 0 | 1 | 0 | 0 |
| 30  | 1 | 1 | 0 | 1 | 0 | 0 | 1 | 0 | 0 | 0 | 0 | 0 | 1 | 0 | 0 | 0 |
| 35  | 1 | 1 | 0 | 1 | 0 | 0 | 1 | 0 | 0 | 0 | 0 | 1 | 0 | 1 | 0 | 0 |
| 40  | 1 | 1 | 1 | 0 | 0 | 0 | 1 | 0 | 1 | 0 | 0 | 0 | 1 | 0 | 0 | 0 |
| 45  | 1 | 1 | 1 | 0 | 0 | 0 | 1 | 0 | 1 | 0 | 0 | 1 | 0 | 1 | 0 | 0 |
| 50  | 1 | 1 | 0 | 0 | 1 | 0 | 1 | 0 | 0 | 0 | 0 | 0 | 1 | 0 | 0 | 0 |
| 55  | 1 | 1 | 0 | 0 | 1 | 0 | 1 | 0 | 0 | 0 | 0 | 1 | 0 | 1 | 0 | 0 |
| 60  | 1 | 1 | 1 | 0 | 1 | 0 | 0 | 0 | 0 | 0 | 0 | 0 | 1 | 0 | 0 | 0 |
| 65  | 1 | 1 | 1 | 0 | 1 | 0 | 0 | 0 | 0 | 0 | 0 | 1 | 0 | 1 | 0 | 0 |
| 70  | 1 | 1 | 0 | 1 | 0 | 1 | 1 | 0 | 1 | 0 | 0 | 0 | 1 | 0 | 0 | 0 |
| 75  | 1 | 1 | 0 | 1 | 0 | 1 | 1 | 0 | 1 | 0 | 0 | 1 | 0 | 1 | 0 | 0 |
| 80  | 1 | 1 | 0 | 0 | 0 | 0 | 0 | 0 | 0 | 0 | 0 | 0 | 1 | 0 | 0 | 0 |
| 85  | 1 | 1 | 0 | 0 | 0 | 0 | 0 | 0 | 0 | 0 | 0 | 1 | 0 | 1 | 0 | 0 |
| 90  | 1 | 1 | 0 | 0 | 0 | 0 | 1 | 0 | 1 | 0 | 0 | 0 | 1 | 0 | 0 | 0 |
| 95  | 1 | 1 | 0 | 0 | 0 | 0 | 1 | 0 | 1 | 0 | 0 | 1 | 0 | 1 | 0 | 0 |
| 100 | 0 | 0 | 0 | 0 | 0 | 1 | 0 | 0 | 0 | 0 | 0 | 0 | 1 | 0 | 0 | 0 |
| 105 | 0 | 0 | 0 | 0 | 0 | 1 | 0 | 0 | 0 | 0 | 0 | 1 | 0 | 1 | 0 | 0 |
| 110 | 0 | 0 | 1 | 1 | 0 | 1 | 1 | 0 | 1 | 0 | 0 | 0 | 1 | 0 | 0 | 0 |
| 115 | 0 | 0 | 1 | 1 | 0 | 1 | 1 | 0 | 1 | 0 | 0 | 1 | 0 | 1 | 0 | 0 |
| 120 | 0 | 0 | 0 | 1 | 0 | 0 | 0 | 1 | 0 | 0 | 0 | 0 | 1 | 0 | 0 | 0 |
| 125 | 0 | 0 | 0 | 1 | 0 | 0 | 0 | 1 | 0 | 0 | 0 | 1 | 0 | 1 | 0 | 0 |
| 130 | 0 | 0 | 0 | 1 | 0 | 0 | 1 | 0 | 0 | 0 | 0 | 0 | 1 | 0 | 0 | 0 |
| 135 | 0 | 0 | 0 | 1 | 0 | 0 | 1 | 0 | 0 | 0 | 0 | 1 | 0 | 1 | 0 | 0 |
| 140 | 0 | 0 | 1 | 0 | 0 | 0 | 1 | 0 | 1 | 0 | 0 | 0 | 1 | 0 | 0 | 0 |
| 145 | 0 | 0 | 1 | 0 | 0 | 0 | 1 | 0 | 1 | 0 | 0 | 1 | 0 | 1 | 0 | 0 |
| 150 | 0 | 0 | 0 | 0 | 1 | 0 | 1 | 0 | 0 | 0 | 0 | 0 | 1 | 0 | 0 | 0 |
| 155 | 0 | 0 | 0 | 0 | 1 | 0 | 1 | 0 | 0 | 0 | 0 | 1 | 0 | 1 | 0 | 0 |
| 160 | 0 | 0 | 1 | 0 | 1 | 0 | 0 | 0 | 0 | 0 | 0 | 0 | 1 | 0 | 0 | 0 |

*FIG. 7*

VEHICLE MONITORING SYSTEM

This invention relates to a monitoring system, and in particular such a system having a single display means on which there can be displayed successively the value of a plurality of variables to be monitored. A particular application of the invention is in a motor vehicle where a single display means can be used to indicate the level of the fuel in the tank, the oil pressure of the engine, the temperature of the coolant and the voltage of the battery.

Hitherto it has been general to provide in a motor vehicle in addition to the speedometer required by the traffic laws of most countries, other dials displaying at least the fuel level and possibly in addition the temperature of the coolant, the battery voltage and the oil pressure. It has been proposed to employ electronic means for monitoring these variables and to produce digital displays of the values, but if separate analogue digital conversion systems are used for each of these variables then the cost of the electronic equipment can be so large as to prevent the use of the digital display in any but the most expensive vehicles, in which the display would be a feature used to promote the sales.

It is an object of the present invention to reduce this difficulty.

According to the invention there is provided a monitoring system having a single display means on which can be displayed successively the values of a plurality of variables to be monitored, multiplex means for applying electrical signals representing the variables successively to a common conductor, a sequence timer for controlling the multiplexing, a single analogue to digital conversion means responsive to the signals on the common conductor to produce a succession of digital outputs respectively representing the variables, and control means for the display means for receiving each digital output and causing the display means to produce the corresponding display wherein the multiplex means includes means for making similar the ranges of the signals representing the values of the variables.

The sequence timer may be connected to the control means for selectively altering the display produced for at least one variable.

The form of the display may be digital, that is to say in the form of numbers which can be read, or it may be in the form of a quantised analogue display in which, for example, electroluminescent elements are used to mimic the movement of a needle or other indicator.

The system may also include means for producing alarm indications for any or all of the variables, the indications to be produced when the value of any variable is at a level calling for some action on the part of an operator. In the case of motor vehicles, for example, the alarm indications could include a critically low value of oil pressure, a critically high value of coolant temperature or a low fuel level. The alarm indications, being derived from a multiplexed system, may be held by suitable storage circuits to provide a suitable continuous indication. The storage circuit may include some means for counting the occurrences of a critical value before an alarm indication is given so that the generation of spurious indications due to noise, for example, is avoided. In the case of a motor vehicle, the value of oil pressure at which the alarm is generated may be different when the engine is idling from when it is running at a high speed during the normal running of the vehicle.

The transition from a low value to a high one may be effected simply by means of a switch attached to the throttle pedal, for example, of the vehicle, or it may be controlled by means of a frequency sensitive circuit connected to respond to the ignition pulses of the engine or to any other tachometric input. An example of such a circuit is disclosed by copending U.S. patent application Ser. No. 527,553 filed Nov. 27, 1974 by James Sneddon Gordon for FREQUENCY RESPONSIVE CIRCUIT and assigned to the assignee of the present Application.

The system may include manually operable means, for example in the form of a plurality of buttons respectively corresponding to the variables, to enable the display to hold the indication relating to any particular variable.

Many of the transducers used to generate electrical signals from pressure or temperature have near logarithmic characteristics, and by suitable choice of the transducers a close match between the characteristics can be obtained so that a single logarithmic amplifier may be provided in the input to the analogue digital conversion means to linearise the relationship between the voltage fed to the conversion means and the value of the variable it represents. The multiplexing means may include resistive networks to enable the range of voltage input to the analogue digital conversion means to be the same for all of the variables. Offset voltages may be switched in to an input of the logarithmic amplifier by the sequence timer controlling the multiplexing means. When the system is used to produce the digital display, using, for example, the well-known seven segment numeric cipher generators, the control signals for the segment of these generators may be used to provide a simple logical means for detecting the occurrence of a critical value at which an alarm indication should be produced. As the critical values will be different for the different variables the output of the sequence timer must also be fed to the logical means for detecting the occurrence of a particular value because the output of the sequence timer determines which variable is being monitored at the time.

In order that the invention may be fully understood and readily carried out into effect, it will now be described with reference to the accompanying drawings of which:

FIG. 7 shows Table 1 in which the display signals necessary to activate the display segments are tabulated.

Figure 1:
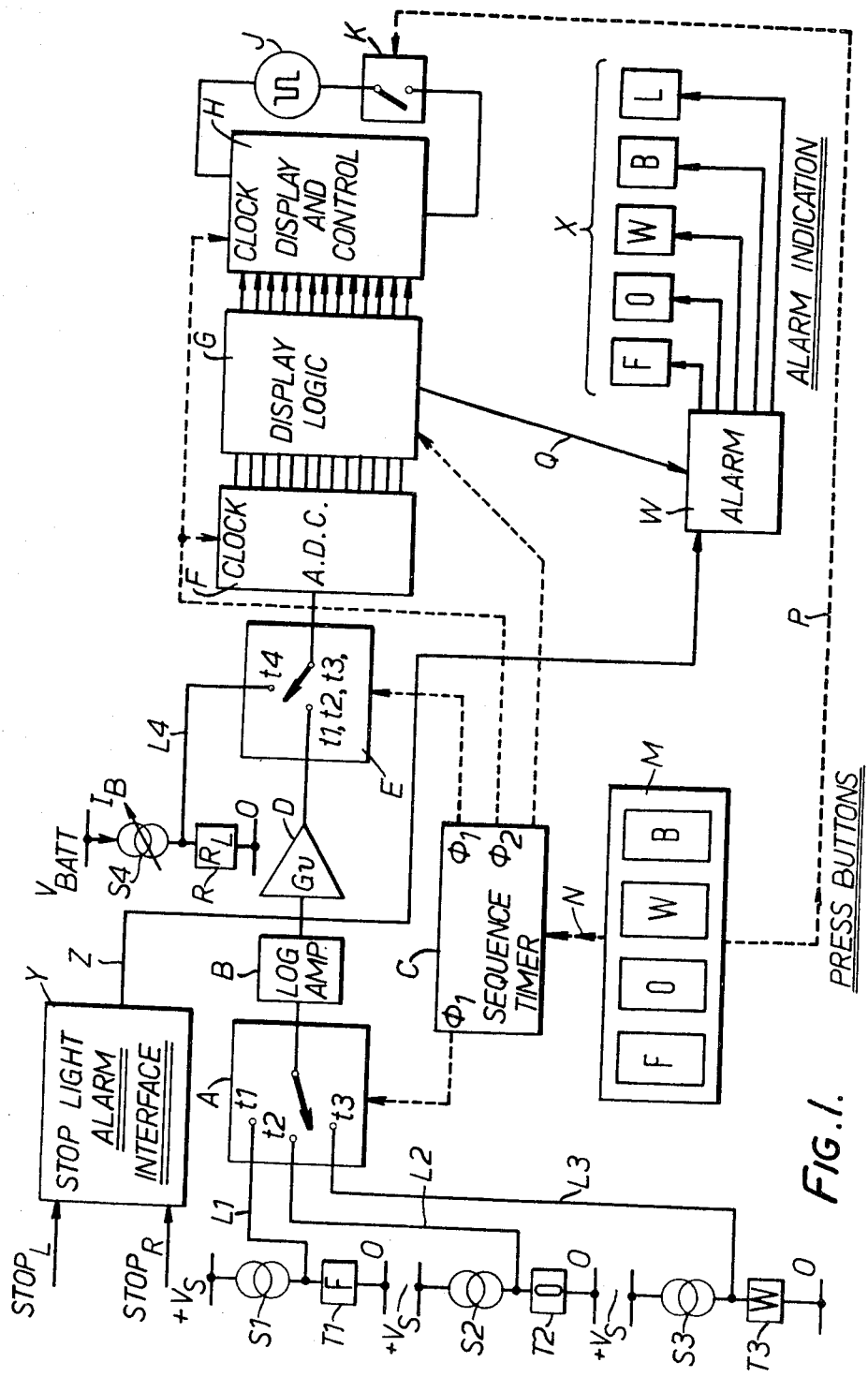
FIG. 1 is a diagram predominantly in block form showing one example of a system according to the invention.

Referring now to FIG. 1, the system shown includes three transducers T1, T2 and T3, of which the electrical resistivity is a logarithmic function of the fuel level, the engine oil pressure and the water temperature respectively of a motor vehicle. The transducer T1 may be a variable resistor operated by a float, the transducer T2 a pressure sensitive resistor, and the transducer T3 a temperature sensitive resistor, for example. Constant currents are fed to the transducers T1, T2 and T3 from sources S1, S2 and S3 respectively from a voltage supply Vs of the vehicle. A voltage representing the fuel level is applied along a conductor L1 to a multiplexing switch A, to which voltages representing the oil pressure and the water temperature are also fed, along conductors L2 and L3 respectively. The output voltages from the switch A are applied to a logarithmic amplifier, the switch A being controlled by an output of a sequence timer C, which may, for example, include a one bit shifting register or a ring counter operated by a suitable clock pulse generator so as to produce the desired cyclic succession of outputs. Because of the logarithmic characteristic of the amplifier B the output voltage of this amplifier represents linear functions of the fuel level, oil pressure and water temperature successively, and this voltage is applied to a second switch E after amplification in a linear amplifier D such as an operational amplifier and may be formed by a single integrated circuit. Another input is fed to the switch E over a conductor L4 from a resistor R to which is applied a current IB dependent on the battery voltage Vbatt. It will be appreciated that the voltage fed along the conductor L4 is linearly proportional to the battery voltage and need not be fed through a logarithmic amplifier in the same way as the voltages derived from the other three variables. The switch E is operated in conjunction with switch A by the sequence timer C so that at the output of the switch E voltages proportional to the four variables appear cyclically. The switches A and E may conveniently consist of electronic gates operated in cyclic succession by the outputs of the sequence timer C. The voltages from the switch E are applied to an analogue to digital convertor F which produces a five digit binary coded output representing the magnitude of the incoming voltages present at the time. Typically, the analogue to digital convertor F may consist of a fixed ramp generator, a comparator for comparing the output of the ramp generator with the input signal and a clock feeding a counter for the interval of time taken for the ramp to reach the input signal level, so that the total registered in the counter represents the input signal. Display logic circuits G respond to the binary coded output of the convertor F to produce combinations of outputs for energising the segments of an electroluminescent display H. The convertor F and display H also receive control signals from the sequence timer C. The timer C also controls the display logic circuits G in the manner to be described in detail later.

A manual control unit M consisting of four press-buttons or other manually operated switches respectively labelled F, O, W and B, is provided, and is connected via a conductor N to the sequence timer C and also via conductor P to a relay K connected in series with a pulse source J for causing the display H to produce a visible output representing the value of the variable selected by the pressing of one of the buttons of the unit M.

Figure 6:
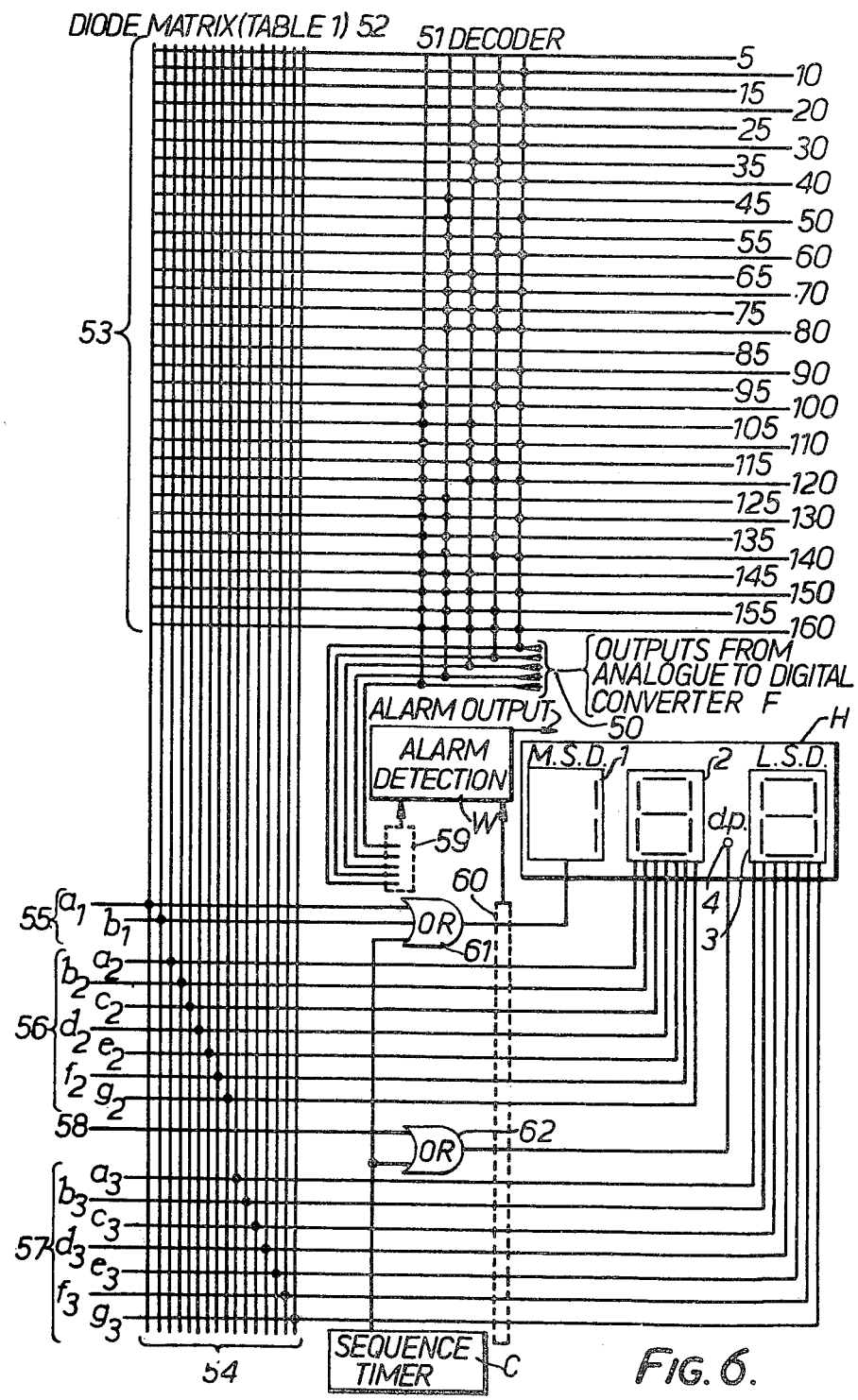
FIG. 6 shows one possible form for the display logic of FIG. 1.

The display logic circuits G, which are shown in more detail in FIG. 6, are connected via a conductor Q to an alarm circuit W which is connected to five alarm indication lamps X respectively labelled F, O, W, B and L, which are illuminated when a critical level of one of the variables is detected, or in the case of the lamp L when an indication is received that one of the braking lights of the vehicle is not functioning. An indication that a braking light of the vehicle is not functioning can be obtained from the braking light circuit by means of a system such as an integrated circuit type SN 76557 B available from Texas Instruments Incorporated, Dallas, Tex., or in any other convenient manner. The block Y represents a suitable system and it is connected to the alarm circuit W by means of a conductor Z.

In the operation of the system described above voltages logarithmically related to the values of the three variables, fuel level, oil pressure and water temperature, appear successively at the output of the switch A under the control of the sequence timer C and after linearisation by the logarithmic amplifier B and amplification by the amplifier D are applied to the switch E. Because of the linked operation of the switches A and E the output of the switch E consists of voltages representing linear functions of the three variables plus a voltage representing a linear function of the battery voltage in cyclic succession. Typically, each variable is sampled for 20 ms. every 500 ms., although slower or faster rates of multiplexing could be employed. These voltages are converted to digital form by the convertor F and the logic circuits G cause the production of appropriate signals for illuminating a three digit decimal display using conventional seven segment electroluminescent digits.

Figure 2:
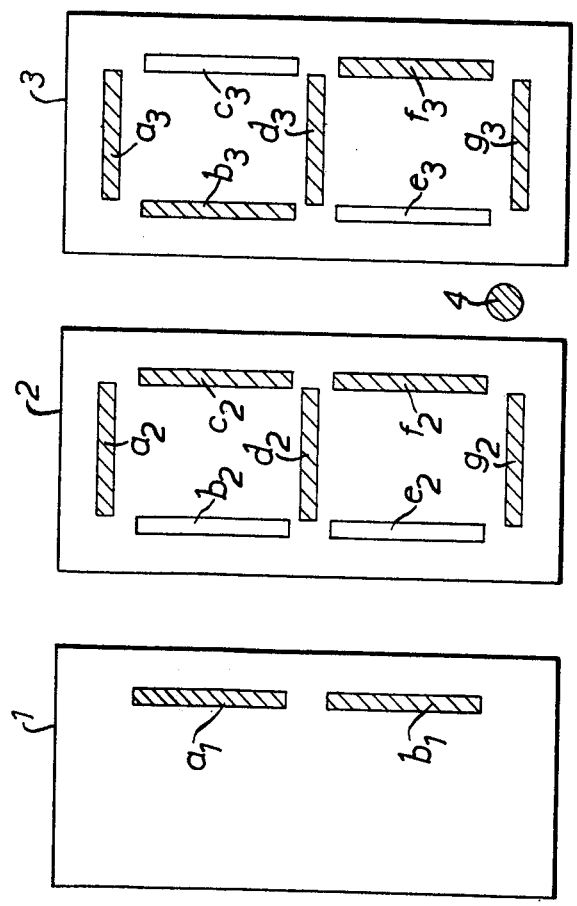
FIG. 2 shows one example of a digital display which could be produced by a system according to the invention.

FIG. 2 shows an example of a typical display which could be contained in the block H and includes first, second and third members 1, 2 and 3, of which the members 2 and 3 include the full seven segment decimal digit display units, and the member 1 includes only two segments because in the system being described all that is required to be produced by the first member is a "1", otherwise the member 1 produces no display. Between the second and third members 2 and 3 lies another electroluminescent member 4 used to produce a decimal point when required. It will be apparent from examination of FIG. 2 that the display illustrated represents the value 13.5.

Since the digital output from the convertor F represents cyclically the values of the four variables to be monitored by the system, it is necessary to provide some control of the display H so that the value of a particular variable can be held in the display whilst the driver reads it. To achieve this the press-buttons M are provided which are arranged to control the display so that when the button corresponding to a particular variable is pressed the value of this variable is held by the display until the button is released again. However, it is desirable that the monitoring system continues to check the values of the variables cyclically to detect the attainment of a critical value of one variable whilst the value of another variable is being displayed, because the vehicle can, of course, still be driven when certain alarms, such as low fuel level, are being displayed. This may be achieved in a number of different ways, one of which is to allow the display logic outputs to continue to follow the cyclic succession of values of the four variables, but the relay K is controlled to cause the display H to emit light only when signals from the logic circuits G represent the value from the particular one of the variables corresponding to the selected one of the buttons M which is pressed at the time. A holding circuit could be provided for maintaining the display of the value of a particular variable for, say, three seconds after the button has been pressed and the button may include a lamp to indicate the one which has been pressed.

In order that the convertor F can be used for all of the variables, it is necessary to ensure that the voltage ranges representing the useful ranges of these variables are all the same. Considering the values of the variables themselves, the fuel level can vary from 0 to 100 percent of a tankful so that the values to be displayed lie between 0 and 100 and an alarm indication should be given when, for example, 10 percent of the tank remains. The oil pressure is likely to vary between 0 and, say, 6.0 Kg/cm² with an alarm level at perhaps 0.5 Kg/cm² when the engine is idling and say 1.0 Kg/cm² when it is running at, say, 3,000 r.p.m. The water temperature is likely to have a normal value of 85°C with an alarm indication to be produced when the temperature exceeds, say, 115°C. It might also be desirable to produce an alarm indication if the water temperature is too low as possibly indicating a blockage in the cooling system or failure of a thermostat. The voltage of the battery would normally lie between, for example, 12 and 15 volts and an alarm indication should be given if the voltage lies outside the range 10.5 to 15.5 volts.

The currents produced by the sources S1 to S4, the resistance of the resistor R and the characteristics of the transducers T1 to T3 are adjusted so that the input voltages of the convertor F are all similar to each other so that, for example, a two decimal digit display selectively with an initial digit 1 can be used to provide an indication of the percentage of the tank occupied by fuel, the oil pressure in Kg per square centimetre and the water temperture in °C. In the case of the battery voltage, however, in order to overcome the difficulty that this normally lies at one end of the range, it is proposed to use the sequence timer C to cause the display H to produce the initial digit 1 (using the member 1 shown in FIG. 2) in front of the two decimal digits and a decimal point between the two decimal digits so that the display of battery voltage lies between 10 and 19.5 volts. The decimal point would also be used in the display of the oil pressure. Should the battery voltage fall below 10 volts then clearly some urgent action is required if this condition is maintained and it is proposed that a separate alarm should be provided for indicating this condition, as it is possible that the operation of the monitoring system described herein would be adversely affected by such a reduction in the supply voltage. The separate alarm could, for example, be embodied in the current source S4 or added to the resistor R.

Referring now to FIG. 2, the two decimal digits are represented by the rectangles 2 and 3 and each contains seven segments, $a$, $b$, $c$, $d$, $e$, $f$ and $g$ bearing as a suffix the number of the particular rectangle. The additional 1 indicator is shown as the rectangle 1 and contains only two segments $a_1$ and $b_1$ which are both illuminated when the battery voltage is being displayed. A separate optical display member 4 is provided to produce the decimal point. The display signals necessary to activate the segments to produce visual indications of 32 values from 5 to 160 are shown in Table 1 in which 1 indicates that the particular segment is not energised and "0" indicates that it is energised. The decimal point is, of course, energised when the battery voltage or oil pressure is selected and the one at the beginning of the number is also energised to display the battery voltage. It is proposed that the display should operate at steps of five units because a greater accuracy than this is not normally required and the cost of the system can be kept down by keeping the logic to the simplest possible.

FIG. 6 shows one example of the construction of the display logic G of FIG. 2 in which the five binary coded outputs from the converter F are applied in parallel to the five conductors 50. These conductor are respectively connected to the vertical conductors of a decoder 51 which may be a diode matrix of conventional type, for example. The decoder 51 has 32 output conductors, 53 respectively corresponding to the different values representable by five binary digits. The dots shown in the decoder 51 in the drawing represent the locations of the diodes. The conductors 53, to which are allocated respective values from 5 to 160 as shown, form the input to a diode matrix 52, in which diodes are located at the intersections of the input conductors 53 of the matrix with output conductors 54 therefor in accordance with the distribution of 0s in Table 1. There are 16 conductors 54 of which a group 55 of two conductors are connected to energise the most significant digit 1 of the display, a first group 56 of seven conductors are connected to energise the middle digit 2 and a second group 57 of seven conductors are connected to energise the least significant digit 3. The conductors 50 are connected to the alarm detection circuit W where logical combinations of the signals present on those conductors together with the signal present on the conductors 55, 56, 57 and 58 are used to generate the alarm indications as described in detail below. The broken rectangles 59 and 60 represent the selective logical connections.

Since the most significant digit 1 is a 1 or is left blank a single input only is needed and consequently the two conductors 55 are connected through an OR-gate 61 to the digit 1, there being an additional input to this gate from the sequence timer C to enable the battery voltage display. The sequence timer C is also connected to an input or another OR-gate 62 for energising the decimal point 4. A second input to the gate 62 is from a conductor 58 which may in certain circumstances be connected to an output of the diode matrix 52.

It is proposed to use the display logic in the generation of alarm signals so as to avoid the need for providing relatively complex comparison circuits which would add materially to the cost of the system. For example, consider the generation of an alarm when the battery voltage falls to 10.5 volts. At 10.5 volts the segments $a_1$, $b_1$, $a_2$, $b_2$, $c_2$, $e_2$, $f_2$, $g_2$, $a_3$, $b_3$, $d_3$, $f_3$ and $g_3$ are illuminated as well as the segment 4. The value 10.5 can be distinguished from 15, 14, 13, 12 or 11 by the energisation of the segment $d_3$, and energisation of the segments $b_2$ and $e_2$ will distinguish it from 15.5, 14.5, 13.5, 12.5 and 11.5 volt values. Clearly therefore a simple gate could be employed to detect the simultaneous energisation of the segments $b_2$ and $e_2$ when the battery voltage is being monitored and this would indicate that the voltage has decreased to 10.5 or 10 volts. The segments $b_2$ and $e_2$ would also be energised at 16 volts but since an alarm indication should be given for this value as well the single gate could be used for both alarm indications. 15.5 volts could be detected by the simultaneous energisation of sectors $a_2$, $b_2$ and $d_3$. Similar simple logical arrangements can be provided for detecting the occurrence of other critical values, taking into consideration the signals from the sequence timer C which determines which of the variables is being monitored at the time. The binary coding could be used in addition to the segment energisation if necessary.

It may be desirable to maintain a continuous alarm indication and consequently the alarm circuit W may include trigger circuits for storing the alarm condition in response to the detection of values outside the normal operating range, which trigger circuits are re-set just before the particular variable is monitored in the next cycle. As indicated above, the trigger circuits may be arranged to require several occurrences of a value outside the normal operating range before being set so as to avoid the generation of spurious alarms. This last feature would probably not be used for the oil pressure alarm.

Figure 3:
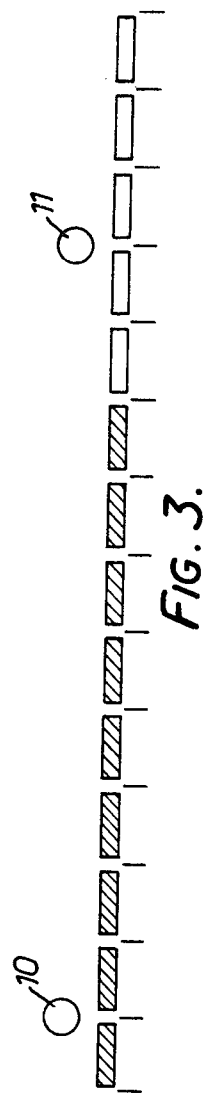
FIG. 3 shows one form of quantised analogue display which could be employed.
Figure 4:
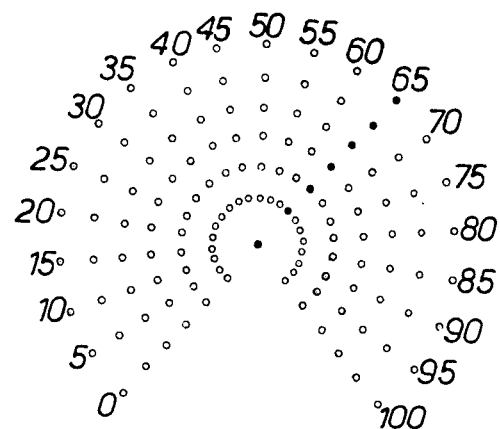
FIG. 4 shows another form of quantised analogue display which could be employed.

Instead of providing a digital display of the values of the variables, quantised analogue displays could be provided and FIGS. 3 and 4 show alternative examples of forms which such a display might take. In FIG. 3 a line of electroluminescent segments is provided and these are illuminated in sequence by the display logic circuits G to provide a line of light of length representing the value of the particular variable selected. To provide an indication of 5 percent accuracy 20 such segments should be provided. The circles 10 and 11 represent other electroluminescent segments which are used to provide lower and upper alarm indications.

FIG. 4 shows a modification of the arrangement of FIG. 3 in which the electroluminescent elements are arranged to form a series of lines radiating from a point and these are illuminated to provide a display similar to that of a needle moving round a dial. Many other quantised analogue displays are possible and would be suitable alternatives to those shown in FIGS. 3 and 4.

When such quantised analogue displays are used, it is desirable to arrange that the permissible range of values for each variable being monitored lies in the same range of positions of the display so that the driver can tell rapidly whether the value indicated lies in the safe range or not and whether any action on his part is required.

Figure 5:
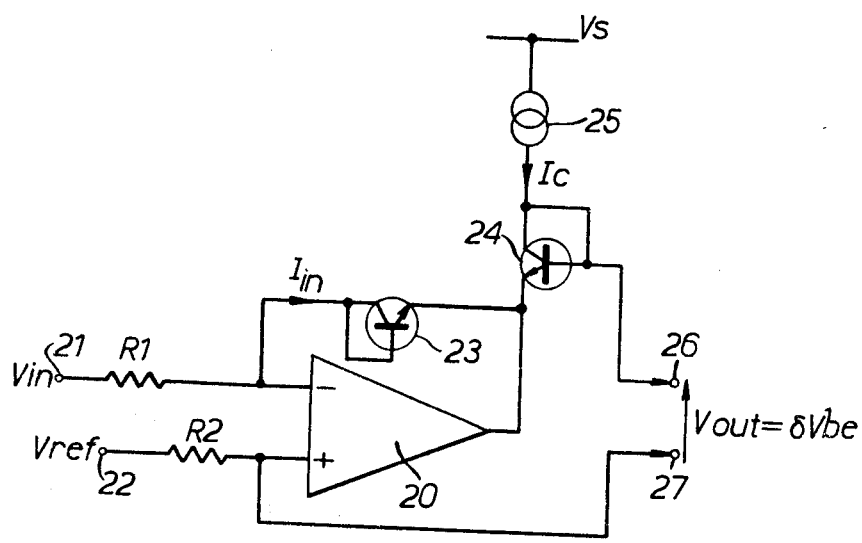
FIG. 5 shows one possible form of construction for the logarithmic amplifier used in the example of the invention shown in FIG. 1.

FIG. 5 shows one possible form of construction for the logarithmic amplifier B of FIG. 1 and includes an operational amplifier 20 which may be an integrated circuit amplifier of suitable type the inverting input of which is connected through a resistor R1 to an input terminal 21 for the voltage from the multiplexing switch A. The non-inverting input of the amplifier 20 is connected through a resistor R2 to a terminal 22 for a reference voltage supply, which may be switched to a different value for the different variables being monitored by the system. The output terminal of the amplifier 21 is connected to the emitter electrodes of two transistors 23 and 24, of which the transistor 23 has its base and collector electrodes connected together and to the inverting input of the amplifier 20. The base and collector electrodes of the transistor 24 are also connected together and in addition receive a constant current $I_c$ from a current source 25 energised by the supply voltage Vs. The output voltage from the logarithmic amplifier is derived from between the collector (and base) of the transistor 24 which are connected to one output terminal 26 and the non-inverting input of the amplifier 20 which is connected to a second output terminal 27.

In the operation of the circuit of FIG. 5 the gain of the amplifier 20 depends on the resistance of the path provided by the transistor 23 between the output of the amplifier 20 and its inverting input. The resistance offered by the transistor 23 depends on the current through it, which in turn is regulated by the transistor 24 in response to the output at the terminal 26. As a result of the division of the current between the emitter electrodes of the transistors 23 and 24, it may be shown that the output voltage is given by the expression:

$$V_{out} = -26 \log \left( \frac{V_{in} - V_{ref}}{I_c \cdot R1} \right) \text{mv}.$$

The provision of the input 22 for the reference voltage enables different offset voltages to be used for the different variables to be monitored so that the same range of output voltages can be generated from the logrithmic amplifier for all of the variables.

Although the invention has been described with reference to a specific embodiment for use in motor vehicles, it will be appreciated that it can be employed in other fields as well. In motor vehicles variables other than those mentioned above may be monitored. The monitoring and displaying extra variables does not cause an appreciable increase in the cost of the system because the basic components are substantially unchanged.

We claim:

1. A monitoring system having a single display means for displaying successively the values of a plurality of variables to be monitored; a plurality of signal channels; analog to digital conversion means having a single analog input channel common to all of said signal channels; for each signal channel, individual means for monitoring a respective one of said variables to produce an analog signal having an amplitude characteristic of said variable; means for adjusting the amplitudes of said analog signals to lie within a range of values common to all of said channels; sequence timer means; multiplexer means operable by said sequence timer means to apply said adjusted amplitude analog signals in succession to said common input channel of said analog-digital conversion means for generation of successive digital outputs respectively representing the monitored values of said variables; and display control means for applying said digital outputs (under control) said sequence timer means without storage to said display means for generating successive displays characteristic of the monitored values of said variables.

2. A monitoring system according to claim 1, wherein said means for adjusting said analog voltage amplitudes includes differential amplifier means having a first input for receiving said analog signals from said signal channels and a second input for receiving offset inputs such that the output signal amplitude of said amplifier means lies within a range common to all of said signal channels.

3. A monitoring system according to claim 1 including means connecting said sequence timer means to said display control means for selectively altering the display produced for at least one of said variables.

4. A system according to claim 1 wherein said display means comprises digital display means.

5. A system according to claim 4, wherein said digital display means is adapted to produce a two-digit decimal display of a variable.

6. A system according to claim 4 wherein said digital display means includes digit display and part-digit display devices for generating said display; wherein said display control means includes logic means; and means connecting the digital outputs of said analog to digital conversion means to said logic means for selective energization of said digit display and part-digit display devices.

7. A system according to claim 6, including an electro-luminescent display device alarm indicator for at least one of said variables; means connecting said sequence timer means and said logic means to said alarm indicator for operation thereof when the monitored value of said variable reaches a predetermined critical value.

8. A system according to claim 7 including trigger means having set and reset inputs connected to said logic means for setting of said trigger for actuation of said alarm indicator means in response to said predetermined critical value of said variable and for resetting of said trigger to eliminate actuation of said alarm indicator means in response to a second predetermined value of said variable.

9. A system according to claim 7, wherein said means for actuating said alarm indicator means is adapted to be actuated only in response to a plurality of outputs from said logic means corresponding to said predetermined critical value of said variable.

10. A system according to claim 1, wherein said display control means is connected to said display means for energizing a particular digit each time the value of a preselected variable is being displayed.

11. A system according to claim 1, wherein said display means is adapted to produce a quantized analog display.

12. A system according to claim 11, wherein said display means includes an array of electro-luminescent segments; and means connecting said display control means to said display means for energizing a variable succession of said segments in response to variations in value of a monitored variable.

13. A system according to claim 12, wherein said display means includes a single line of electro-luminescent segments; and wherein said display control means is connected for energization of an increasing number of segments in response to an increasing value of said monitored variable.

14. A system according to claim 12, wherein said array of electro-luminescent segments includes a plurality of groups of segments, each said group arranged to form a line radiating from a common origin; and wherein said lines correspond to respective values of said monitored variable.

15. A system according to claim 1, including override means for said display means, said override means adapted for manual operation to cause said display means to display only the value of a selected one of said variables.

16. A system according to claim 15, wherein said manually operable means comprises a plurality of push-buttons respectively corresponding to said monitored variables.

17. A system according to claim 16, including storage means associated with said push-buttons and means operably connecting said storage means to said display means for maintaining a display of the value of said selected variable for a predetermined period of time.

18. A system according to claim 15, including means for generating an alarm indication for at least one of said variables in response to a predetermined monitored value of said variables in response to a predetermined monitored value of said variable, said indication producing means adapted to remain operable when said manually operable means is operated to cause the display of the value of any selected variable.

19. A system according to claim 1, wherein at least one of said monitoring means comprises a transducer adapted to produce an electrical signal which is a logarithmic function of the monitored value of one of said variables; and logarithmic amplifier means connected for converting said logarithmic function signal to a signal which is linearly related to said monitored value.

20. A system according to claim 19, wherein a plurality of said monitoring means comprise transducers adapted to produce electrical signal which are logarithmic functions of the monitored values of respective ones of said variables, and wherein said multiplexer means is connected to apply said logarithmic function electrical signals successively to said logarithmic amplifier means.

* * * * *